US009780181B1

(12) United States Patent
Teo et al.

(10) Patent No.: US 9,780,181 B1
(45) Date of Patent: Oct. 3, 2017

(54) SEMICONDUCTOR DEVICE WITH MULTI-FUNCTION P-TYPE DIAMOND GATE

(71) Applicant: Mitsubishi Electric Research Laboratories, Inc., Cambridge, MA (US)

(72) Inventors: Koon Hoo Teo, Lexington, MA (US); Chenjie Tang, Chicago, IL (US); Chungwei Lin, Boston, MA (US)

(73) Assignee: Mitsubishi Electric Research Laboratories, Inc., Cambridge, MA (US)

( * ) Notice: Subject to any disclaimer, the term of this patent is extended or adjusted under 35 U.S.C. 154(b) by 0 days.

(21) Appl. No.: 15/371,360

(22) Filed: Dec. 7, 2016

(51) Int. Cl.
| H01L 31/0256 | (2006.01) |
| H01L 29/47 | (2006.01) |
| H01L 29/778 | (2006.01) |
| H01L 29/20 | (2006.01) |
| H01L 29/205 | (2006.01) |
| H01L 29/66 | (2006.01) |

(52) U.S. Cl.
CPC ........ H01L 29/475 (2013.01); H01L 29/2003 (2013.01); H01L 29/205 (2013.01); H01L 29/66462 (2013.01); H01L 29/7787 (2013.01)

(58) Field of Classification Search
CPC ............. H01L 29/2003; H01L 29/7787; H01L 29/66462; H01L 29/205; H01L 29/778; H01L 29/66431; H01L 29/1602; H01L 29/475
USPC ....... 257/194, 76, 77, 94, E29.246, E21.403, 257/E21.407
See application file for complete search history.

(56) References Cited

U.S. PATENT DOCUMENTS

| 7,728,356 | B2 | 6/2010 | Suh et al. |
| 8,575,657 | B2 | 11/2013 | Gambin et al. |
| 2008/0206569 | A1 | 8/2008 | Whitehead et al. |
| 2010/0155900 | A1 | 6/2010 | Korenstein et al. |
| 2013/0153923 | A1 | 6/2013 | Decoutere |
| 2013/0341635 | A1* | 12/2013 | Cao ........................ H01L 29/432 257/76 |
| 2014/0167058 | A1* | 6/2014 | Laboutin ........... H01L 29/66462 257/76 |

(Continued)

OTHER PUBLICATIONS

Kuzmik et al. "Power Electronics on InAlN/(In)GaN: Prospect for a Record Performance." IEEE Electron Device Letters, vol. 22, No. 11, Nov. 2001. pp. 510-512.

*Primary Examiner* — Thien F Tran
(74) *Attorney, Agent, or Firm* — Gene Vinokur; James McAleenan; Hironori Tsukamoto

(57) ABSTRACT

A semiconductor device includes a substrate, a back-barrier layer arranged on the substrate, the back-barrier layer including first p-type dopant atoms, an intermediate or nucleation layer having a lattice constant different from a lattice constant of the back-barrier layer, a semiconductor heterostructure having a channel layer, a spacer layer on the channel layer and a barrier layer on the spacer layer, wherein a combination of materials of the barrier layer, the spacer layer and the channel layer is selected such that a carrier charge is provided to the channel layer, a gate layer arranged to partially cover a top of the barrier layer, wherein the gate layer includes second p-type dopant atoms, and a set of electrodes for providing and controlling the carrier charge in the carrier channel.

20 Claims, 13 Drawing Sheets

(56) References Cited

U.S. PATENT DOCUMENTS

2014/0264379 A1* 9/2014 Kub ................. H01L 29/41725
257/77
2015/0060947 A1* 3/2015 Koehler ............... H01L 29/267
257/194
2016/0211341 A1 7/2016 Koehler et al.

* cited by examiner

SEMICONDUCTOR DEVICE WITH MULTI-FUNCTION P-TYPE DIAMOND GATE

FIELD OF THE INVENTION

The invention relates generally to a semiconductor device, and more particularly to semiconductor devices with a diamond back-barrier, a nanocrystal diamond passivation layer and a diamond gate.

BACKGROUND OF THE INVENTION

Nitride semiconductor devices play a significant role for high-power and high-frequency applications, due to its outstanding combination of fundamental physical properties, such as large band gaps, large breakdown fields, high electron mobilities, etc. Indium-aluminum-nitride/gallium-nitride (InAlN/GaN) heterostructures are under systematic investigations as an alternative to commercially already available aluminum-gallium-nitride/gallium-nitride (AlGaN/GaN) high-electron-mobility-transistors (HEMTs). The main advantages of the InAiN/GaN heterostructure are the following: 1) an InAlN barrier layer (mole fraction of indium-nitride (InN) of ~17%) can be grown lattice matched to the GaN thereby mitigate strain related defects and improve their reliability; 2) high spontaneous polarization and thus high charge density in the channel (predicted up to ~3×10$^{13}$ cm$^{-2}$); 3) thin barrier thicknesses of typical InAlN/GaN devices (less than 10 nm) enabling the fabrication of highly scaled devices without the need of gate recesses and 4) high thermal and chemical stability allowing high-temperature large-signal operation at 1000° C. However, traditional AlGaN/GaN HEMTs and InAlN/GaN devices operate in the depletion mode (normally-on), and the depletion mode operation of the InAlN/GaN HEMTs is very inconvenient for power conversion applications in addition to safety concerns.

Further, to achieve the high-power requirement in the specifications, thermal management of HEMT structures is the key determining factor needed to be improved for device power capability.

Accordingly, there is a need for a GaN transistor structure that provides a high electron mobility channel operable in the enhance mode with suppressing heat generation around the channel for high frequency and higher power applications.

SUMMARY OF THE INVENTION

Embodiments of the present disclosure relate to semiconductor devices and methods for designing the semiconductor devices that provide high frequency performances and high power performances.

Some embodiments are based on recognition that a way of improving high frequency performances and high power performances of transistors is to design a p-type diamond gate HEMT structure including a diamond barrier layer and a nanocrystal diamond passivation layer.

According to some embodiments of the invention, a semiconductor device includes a substrate; a back-barrier layer arranged on the substrate, the back-barrier layer including first p-type dopant atoms; an intermediate layer having a lattice constant different from a lattice constant of the back-barrier layer; a semiconductor heterostructure having a channel layer, a spacer layer on the channel layer and a barrier layer on the spacer layer, wherein a combination of materials of the barrier layer, the spacer layer and the channel layer is selected such that a carrier charge is provided to the channel layer; a gate layer arranged to partially cover a top of the barrier layer, wherein the gate layer includes second p-type dopant atoms; and a set of electrodes for providing and controlling the carrier charge in the carrier channel.

Further, another embodiment of the invention provides a method for designing a semiconductor device. The method includes steps of selecting a substrate; arranging a back-barrier layer on the substrate, wherein the back-barrier layer includes p-type dopant atoms; arranging an intermediate layer on the back-barrier layer, wherein the intermediate layer has a lattice constant different from a lattice constant of the back-barrier layer; selecting a semiconductor heterostructure having a channel layer, a spacer layer on the channel layer and a barrier layer on the spacer layer, wherein a combination of materials of the barrier layer, the spacer layer and the channel layer is selected such that a carrier charge is provided to the channel layer; arranging a gate layer to partially cover a top of the barrier layer, wherein the gate layer includes p-type dopant atoms; and arranging a set of electrodes for providing and controlling the carrier charge in the carrier channel.

The forgoing and other objects, features and effects of the invention will become more apparent from the following detailed description of the embodiments with reference to the attached drawings.

BRIEF DESCRIPTION OF THE DRAWINGS

The presently disclosed embodiments will be further explained with reference to attached drawings. The drawings shown are not necessarily to scale, while emphasis instead is generally placed upon illustrating the principles of the presently disclosed embodiments.

Figure 1:
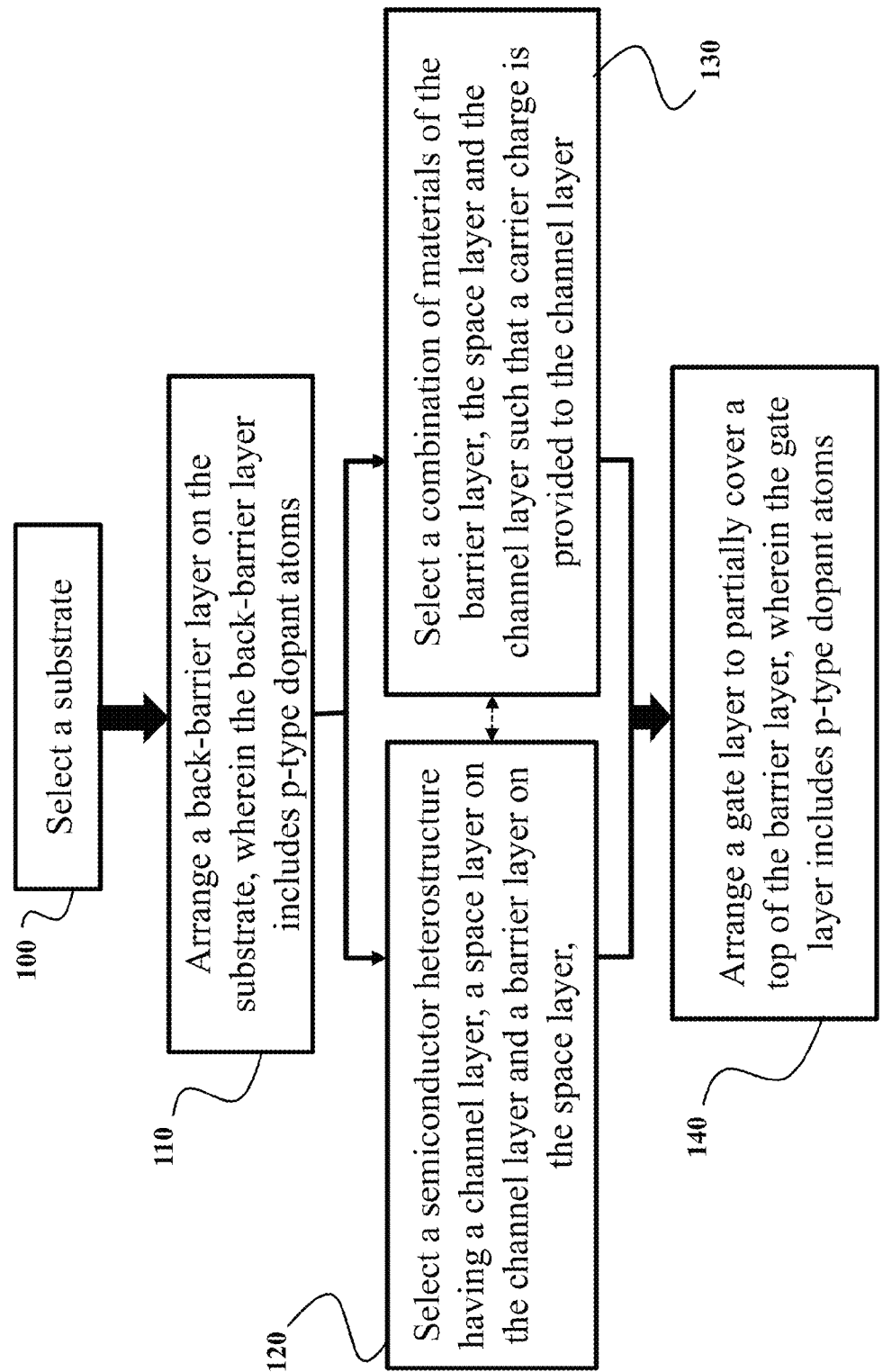
FIG. 1 is a block diagram for illustrating a method for designing a heterostructure transistor according to some embodiments of the invention.

While the above-identified drawings set forth presently disclosed embodiments, other embodiments are also contemplated, as noted in the discussion. This disclosure presents illustrative embodiments by way of representation and not limitation. Numerous other modifications and embodiments can be devised by those skilled in the art which fall within the scope and spirit of the principles of the presently disclosed embodiments.

DETAILED DESCRIPTION OF THE PREFERRED EMBODIMENTS

The following description provides exemplary embodiments only, and is not intended to limit the scope, applicability, or configuration of the disclosure.

Various embodiments of the invention are described hereafter with reference to the figures. It would be noted that the figures are not drawn to scale elements of similar structures or functions are represented by like reference numerals throughout the figures. It should be also noted that the figures are only intended to facilitate the description of specific embodiments of the invention. They are not intended as an exhaustive description of the invention or as a limitation on the scope of the invention. In addition, an aspect described in conjunction with a particular embodiment of the invention is not necessarily limited to that embodiment and can be practiced in any other embodiments of the invention.

Some embodiments of the invention are based on recognition that a method for designing to achieve the enhancement mode (normally-off) operations in GaN based HEMTs is to introduce a p-GaN layer, a p-AlGaN layer or an p-InAlN layer only below the gate electrode to lifts the bands upwards and depletes the 2-dimensional electron gas (2DEG) channel.

Some embodiments of the invention relate to a method for designing GaN based devices, which are based on recognition that GaN layers are epitaxially grown on or wafer-transferred to single-crystal or polycrystalline diamond substrates grown by chemical vapor deposition (CVD). Deposition of nanocrystalline diamond (NCD) coating is also enabled to passivate GaN devices. Further, from a structure point of view, while a backside substrate provides a significant effect in thermal management, the topside approaches such as designing passivation layers and diamond gates are even more important for effectively extracting the heat generated around the 2DEG channel because the passivation layers and the gate locate close to the 2DEG channel.

Further, another embodiment of the invention is based on recognition that a NCD top-side thermal spreading layer is effective to optimize GaN based devices for power switching applications, and a diamond layer overgrown on InAiN/GaN HEMT can be used for a gate layer. Moreover, an embodiment is based on recognition that a boron-doped p-NCD gate AlGaN/GaN HEMT structure can enhance thermal performance and a low leakage current up to gate bias of 10V.

An embodiment of the invention is also based on recognition that a p-NCD gate on a InAiN/AlN/GaN HEMT structure makes it possible to improve thermal performance, enhancing output power density, reducing leakage current and achieving normally-off operation and a NCD layer can be overgrown on an $In_{0.17}Al_{0.83}N$/GaN heterostructure without degrading the characteristics of an HEMT due to the high chemical/thermal stability of the near lattice matched.

Another embodiment of the invention is based on recognition that the back-barrier layer at least partially doped by impurities having a conductivity type opposite to a conductivity type of the carrier channel can improve the characteristic of short channel effects. In this case, the material of the back-barrier layer has a bandgap and thermal conductivity larger than a bandgap and thermal conductivity of GaN, which includes but not limited to boron-doped p-diamond.

According to embodiments of the invention, a p-NCD gate on an InAlN/AlN/GaN HEMT structure can improve thermal performance, enhancing output power density, reducing leakage current and achieving normally-off operation.

Some embodiments of the invention provide a semiconductor device that includes a back barrier on a substrate, a channel layer provided in contact with the upper surface of the back-barrier layer with an intermediate layer, then followed by a spacer layer, a barrier layer, and a set of electrodes for providing and controlling carrier charge in the channel layer, and a passivation layer over the top of the whole device. In accordance with some embodiments, a device may be an InAlN/AlN/GaN high-electron-mobility transistor (HEMT).

Still another embodiment of the invention is based on recognition that a GaN based HEMT structure may include a p-diamond gate electrode directly contact with upper surface of the InAlN barrier layer. In this case, the p-diamond gate electrode can be formed from boron-doped nanocrystalline diamond (NCD).

Further, an embodiment of the invention is based on recognition that the insertion of a thin AlN layer between InAlN and GaN layers can reduce the alloy related interface roughness and therefore improves the electron mobility dramatically. In addition, it also introduces a sharp spike in the conduction band between InAlN and GaN, which can enhance carrier confinement.

In some embodiments, the passivation layer may be a material which has a thermal conductivity higher than GaN, which includes but not limited to nanocrystalline diamond (NCD).

FIG. 1 is a block diagram for illustrating a method for designing a heterostructure transistor according to some embodiments of the invention. The method includes steps 100-140 for designing a device structure. The designing steps include selecting a substrate, arranging a back-barrier layer on the substrate, wherein the back-barrier layer includes p-type dopant atoms, arranging an intermediate layer on the back-barrier layer, wherein the intermediate layer has a lattice constant different from a lattice constant of the back-barrier layer, selecting a semiconductor heterostructure having a channel layer, a spacer layer on the channel layer and a barrier layer on the spacer layer, wherein a combination of materials of the barrier layer, the spacer layer and the channel layer is selected such that a carrier charge is provided to the channel layer, arranging a gate layer to partially cover a top of the barrier layer, wherein the gate layer includes p-type dopant atoms; and arranging a set of electrodes for providing and controlling the carrier charge in the carrier channel.

For instance, the substrate may be a silicon-carbide (SiC) substrate, a GaN substrate or a diamond substrate. After the selection, a back-barrier layer including p-type dopant atoms is arranged on the substrate. For realizing a channel of a HEMT structure, a combination of materials is selected for forming a semiconductor heterostructure having a channel layer, a spacer layer on the channel layer and a barrier layer on the spacer layer such that a carrier charge is provided to the channel layer. In order to form the carrier charge to the channel layer, the spacer layer may have a lattice constant different from a lattice constant of the channel layer, and a bandgap energy of the spacer layer may be greater than a bandgap of the channel layer. Further, the lattice constant of the spacer layer may be smaller than the lattice constant of the channel layer. For instance, the combination of the materials of a barrier layer and a channel layer may be a pair of indium aluminum nitride (InAlN) and gallium nitride (GaN), aluminum gallium nitride (AlGaN) and GaN, aluminum nitride (AlN) and GaN, or indium aluminum gallium nitride (InAlGaN) and GaN. After selecting and determining the semiconductor heterostructure and the combination of the materials of the barrier and channel layers, a gate layer is arranged to partially cover a top of the barrier layer. In this case, the gate layer may include a predetermined density of p-type dopant atoms. As an embodiment, the gate may be formed from a p-type diamond material.

Figure 2:
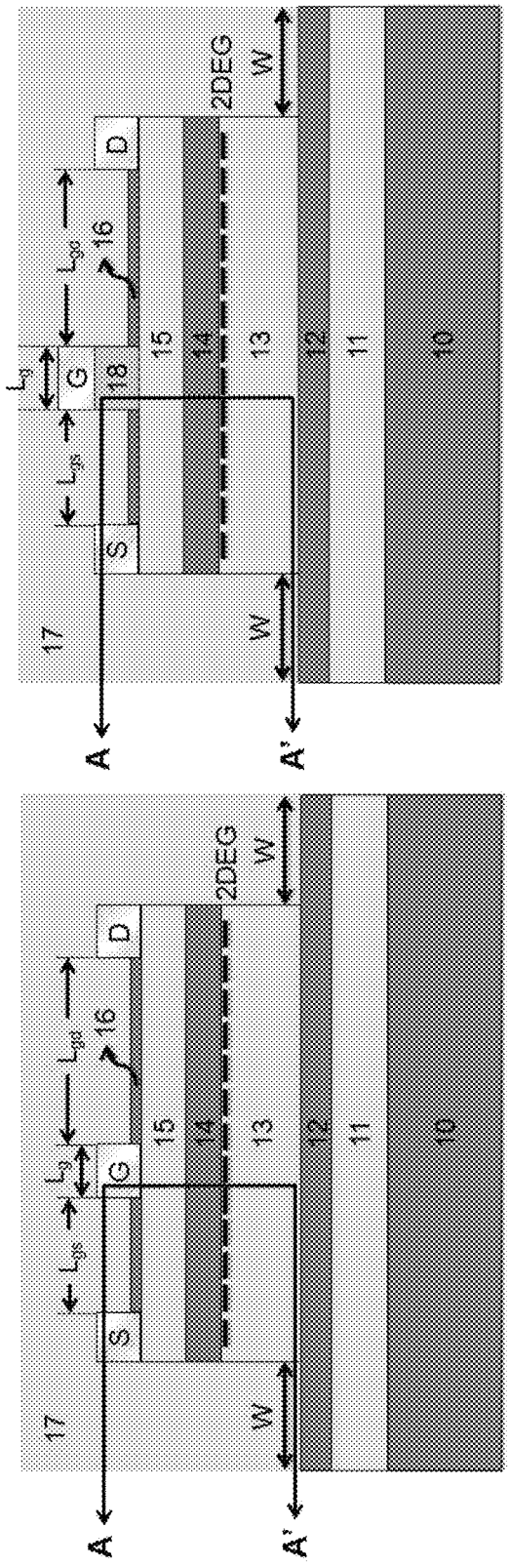
FIG. 2A and FIG. 2B show cross-sectional diagrams of a reference HEMT structure and a p-type gate HEMT structure having a p-type NCD layer under a gate electrode according to some embodiments of the invention.

FIG. 2A and FIG. 2B show cross-sectional diagrams of a reference HEMT structure and a p-type gate HEMT structure having a p-type NCD layer under a gate electrode according to some embodiments of the invention.

The semiconductor devices illustrated in the figures are high-electron mobility transistors (HEMTs). For convenience of explanation, the semiconductor devices in FIG. 2A and FIG. 2B are referred to as device-A and device-B, respectively. The difference in structures of the device-A and the device-B is that the device-B includes a p-type nanocrystalline diamond (p-NCD) layer below a gate electrode, whereas the device-A does not include it.

Each of the device-A and the device-B includes a substrate layer 10, a back-barrier layer 11, a dielectric layer 12 (dielectric region 12 or intermediate layer 12 or nucleation layer 12), a channel layer 13, a spacer layer 14, a barrier layer 15, a first dielectric layer 16 (initial dielectric region 16) and a second dielectric layer 17 (additional dielectric region 17). It should be noted that the device-B includes a p-type gate layer 18 under a gate electrode. See FIG. 2B.

In some embodiments, the substrate layer 10 may include but not limited to a diamond layer. The back-barrier layer 11 may be fully or partially doped by impurities with a conductivity type opposite to the conductivity type of the channel layer 13. The dielectric layer 12 may be a silicon-nitride (SiNx) layer. The channel layer 13 may be an unintentionally-doped (UID) GaN layer, the spacer layer 14 may be an aluminum-nitride (AlN) layer and the barrier layer 15 may be an UID barrier layer formed from an UID-$In_{0.17}Al_{0.83}N$ layer, so that a carrier charge is provided to the channel layer 13. The carrier charge is indicated as 2DEG (two-dimensional-electron-gas) in the figures. The first dielectric layer 16 may be a silicon-nitride ($Si_3N_4$) layer. Further, the initial dielectric layer 16 may be a $Si_3N_4$ layer and the second dielectric layer 17 may be a nanocrystalline diamond (NCD) layer.

According to some embodiments, various methods can be adopted for the formation of the substrate layer 10, including but not limited to a Chemical Vapor Deposition (CVD), a Metal-Organic Chemical Vapor Deposition (MOCVD), a DC plasma CVD. The back-barrier layer 11 is disposed on the substrate layer 10 with an exemplary thickness of 100 nm to 1 μm. In some embodiments, the material of the back-barrier layer 11 can be a p-type diamond layer doped with p-type dopants such as Boron with an exemplary doping density in a range from $1 \times 10^{16}$ $cm^{-3}$ to $1 \times 10^{21}$ $cm^{-3}$. The p-type dopants in the back-barrier layer 11 can be added during epitaxial growth or can be added by ion implantation after the back-barrier layer 11 is formed.

A semiconductor or intermediate layer 12 is disposed on the diamond back-barrier layer 11 with an exemplary thickness of 25 nm to 100 nm. The intermediate layer 12 can include a single layer or multiple layers, including adhesion, nucleation, transition and other layers for promoting the growth of the compound semiconductor epitaxial layers on lattice-mismatched diamond. The materials of the intermediate layer 12 can be dielectrics such as $SiN_x$ and $SiO_2$, binary III-V materials such as AlN.

An unintentionally-doped (UID) semiconductor channel layer 13 is disposed on the intermediate layer 12 with an exemplary thickness of 50 nm to 200 nm. The material of the intermediate layer 12 can be III-nitride materials. The channel layer 13 can be n⁻-type (i.e., low-level doped n-type material) doped, un-intentionally doped, or p-type doped, but preferably as un-intentionally doped.

An unintentionally-doped compound semiconductor spacer layer 14 is disposed on the III-V semiconductor channel layer 13, with an exemplary thickness of 1 nm to 2 nm. And a compound semiconductor barrier layer 15 is disposed on spacer layer 14 with an exemplary thickness of 5 nm to 10 nm. The materials of the spacer layer 14 and barrier layer 15 have different lattice constants and bandgap energies compared to material of the channel layer 13. In some embodiments, there is a 2DEG channel formed at the top interface of the channel layer 13. In an embodiment, material of the spacer layer 14 can be AlN. And materials of the barrier layer 15 and the channel layer 13 can be InAlN and GaN, AlGaN and GaN, AlN and GaN, or InAlGaN and GaN. And the combination of $In_{0.17}Al_{0.83}N$ and GaN is preferred for forming the barrier layer 15 and the channel layer 13.

According to some embodiments of the invention, various methods can be adopted for the formation of the compound semiconductor channel layer 13, the spacer layer 14 and barrier layer 15, including but not limited to a chemical vapor deposition (CVD), a metal-organic chemical vapor deposition (MOCVD), a molecular beam epitaxy (MBE) and a metal-organic vapor phase epitaxy (MOVPE).

In the case of FIG. 2B, a diamond layer 18 is directly disposed on the barrier layer (a compound semiconductor InAlN barrier layer) 15 as a gate layer 18, with an exemplary thickness of 50 nm to 100 nm. The gate layer 18 is formed under the gate electrode-G and can be doped with p-type dopants such as B with an exemplary doping density of $1 \times 10^{18}$ $cm^{-3}$ to $1 \times 10^{21}$ $cm^{-3}$. The dopants in the p-type gate layer 18 may be added during epitaxial growth or may be added by ion implantation after the gate layer 18 is formed. In one embodiment, the p-type gate layer 18 can be a nanocrystalline diamond (NCD) layer grown by seeding and growth methods.

The set of electrodes includes the source electrode S, the gate electrode G and drain electrode D. In some embodiments, the material to form source/drain electrode S/D can be Ti/Al/Ni/Au metal stack for ohmic contact. In one embodiment without p-NCD layer under the gate, the gate can be formed by the Ni/Au metal stack through a Schottky contact, while in p-NCD gate HEMT embodiment, gate electrode G can be formed by Pt or Pd metal, or Ni/Au metal stack, which makes an ohmic contact instead.

In some embodiments, the initial dielectric layer 16 can be formed as the initial passivation layer in directly contact with InAlN barrier, which is deposited that protects and passivates the InAlN surface during the diamond nucleation layer deposition, diamond thin film layer growth, and diamond etch steps. The materials of the initial dielectric layer 16 can be dielectrics such as SiN$_x$ with an exemplary thickness of 10 nm to 25 nm. The dielectric layer 16 can typically be grown by a chemical vapor deposition (CVD), metal organic chemical vapor deposition (MOCVD), molecular beam epitaxy (MBE) or plasma deposition technique.

The initial dielectric layer 16 can provide a number of benefits, including (1) passivate surface to achieve a low interface state density, (2) protect the InAlN surface from chemical decomposition during the growth of the diamond passivation film 17. An addition passivation layer 17 is disposed on the initial passivation layer 16 with an exemplary thickness of 0.3 µm to 10 µm. The second dielectric layer 17 can be material which has higher thermal conductivity than that of the initial passivation layer 16, such as nanocrystalline diamond (NCD).

Figure 3:
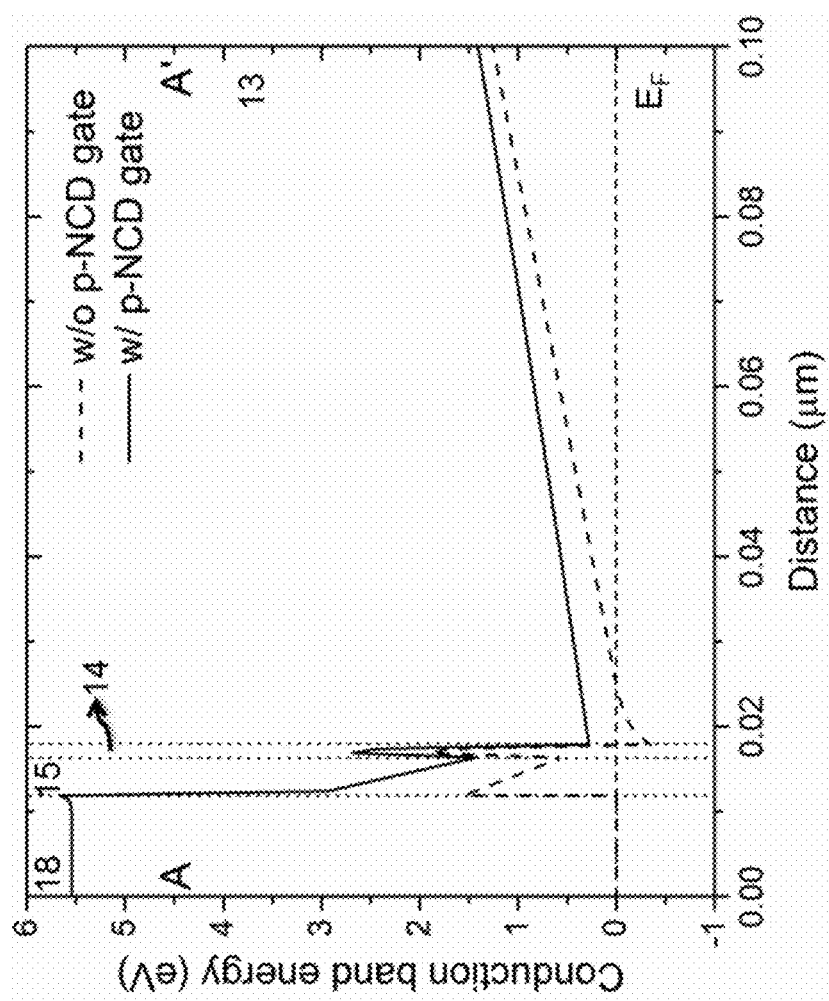
FIG. 3 shows conduction band diagrams of cross-lines AA' of device structures indicated in FIG. 2A and FIG. 2B.

As example structures, FIG. 2A shows a reference HEMT structure and FIG. 2B shows a p-type gate HEMT structure having a p-type NCD layer under a gate electrode according to some embodiments of the invention. The HEMT structures are as follows:

Substrate layer 10: 50 µm to 100 µm thick diamond layer
Back-barrier layer 11: 110 nm p-type diamond with a doping density of $1 \times 10^{18}$ cm$^{-3}$
Intermediate region 12: 25 nm thick SiNx layer
Unintentionally-doped (UID) GaN channel layer 13: 100 nm thick GaN layer
Spacer layer 14: 1 nm thick AlN layer
Unintentionally-doped barrier layer 15: 5 nm thick UID-In$_{0.17}$Al$_{0.83}$N layer
Initial dielectric region 16: 10 nm thick Si$_3$N$_4$ layer
Additional dielectric region 17: 0.3 µm to 5 µm thick nanocrystalline diamond (NCD) layer
Region 18 under the gate: p-NCD with a doping density of $1 \times 10^{18}$ cm$^{-3}$ to $1 \times 10^{21}$ cm$^{-3}$
Gate to Source electrode distance $L_{gs}$: 0.2 µm
Gate to Drain electrode distance $L_{gd}$: 1.7 µm
Gate length $L_g$: 50-200 nm
Gate width: 1 mm
Gate contact metal: Pt FIG. 3 is a simulation result of conduction band diagrams of the cross-lines AA' of HEMT structures shown in FIG. 2A and FIG. 2B. FIG. 3 shows the simulated conduction band diagram of the cross-line AA' within the example structures with and without p-NCD gate. The device is an InAlN/AlN/GaN HEMT having a gate length ($L_g$) of 200 nm, gate to source ($L_{gs}$) spacing of 0.2 µm, and gate to drain ($L_{gd}$) spacing of 1.7 µm. In an embodiment, the gate electrodes can formed by metal or metal stacked layer with large work function including but not limited to Pd, Pt, Ni/Au stacked layer, resulting in an ohmic contact on p-NCD layer. The p-NCD layer can be grown by CVD on the top of InAlN/AlN/GaN epi-layers or possibly deposited by NCD coating following with a p-type doping in NCD. As shown, at the interface between the heterostructure formed by the channel layer 13 and the spacer layer 14 in the device without p-NCD gate, the conduction band $E_c$ dips below the Fermi level $E_f$. Consequently, the electrons are induced due to the piezoelectric polarization and spontaneous polarization to form a 2DEG sheet charge region at the heterostructure. In the structure with p-NCD gate, it lifts up the energy band and enables the conduction band dip at the heterostructure of layer 13 and 14 to be higher than the Fermi level $E_f$. Consequently, the 2DEG is depleted at zero gate bias, resulting in an E-mode operation for the InAlN/AlN/GaN HEMTs. In addition, the insertion of AlN layer 14 between InAlN layer 15 and GaN layer 16 creates a spike barrier between the barrier layer and channel layer in conduction band, which enhances the carrier confinement. In addition, the insertion of thin AlN interlayer 14 can also reduce the alloy related interface roughness and therefore improves the electron mobility.

Figure 4:
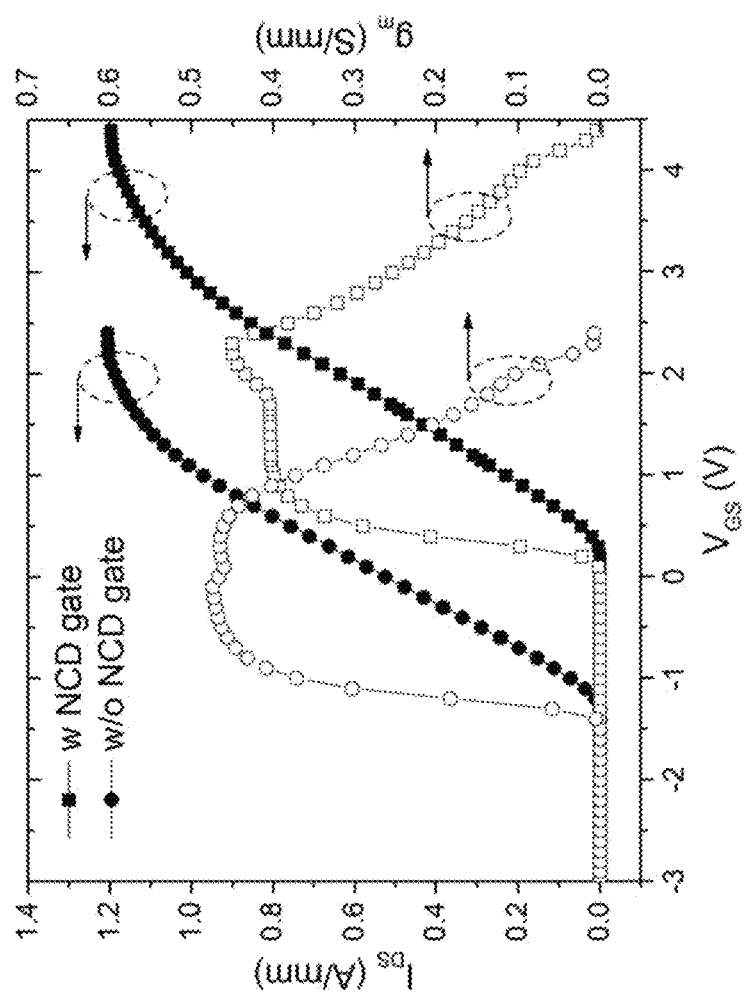
FIG. 4 shows transfer characteristics of transistors indicated in FIG. 2A and FIG. 2B.

FIG. 4 shows transfer characteristics at $V_{ds}$=3V of example structures with and without p-NCD gate corresponding to FIG. 2A and FIG. 2B, respectively. The exemplary doping density and thickness of p-NCD gate is $1 \times 10^{20}$ cm$^{-3}$ and 100 nm, respectively. As shown, by inserting a p-NCD gate, the threshold voltages ($V_{th}$) shifts from −1.5V to 0.25V and therefore normally-off operation is achieved. It should be noted that previous attempts on AlGaN/GaN HEMT with a p-NCD gate has not been successfully achieved the normally-off operation nor a positively shift in $V_{th}$, which is due to the non-uniform doping in p-NCD layer during process. The undoped NCD between III-V barrier and p-doped NCD layer will act as a dielectric layer, which would result in negatively shift of threshold voltage. Thus, the uniform doping in p-NCD is required to achieve normally-off operation.

Figure 5:
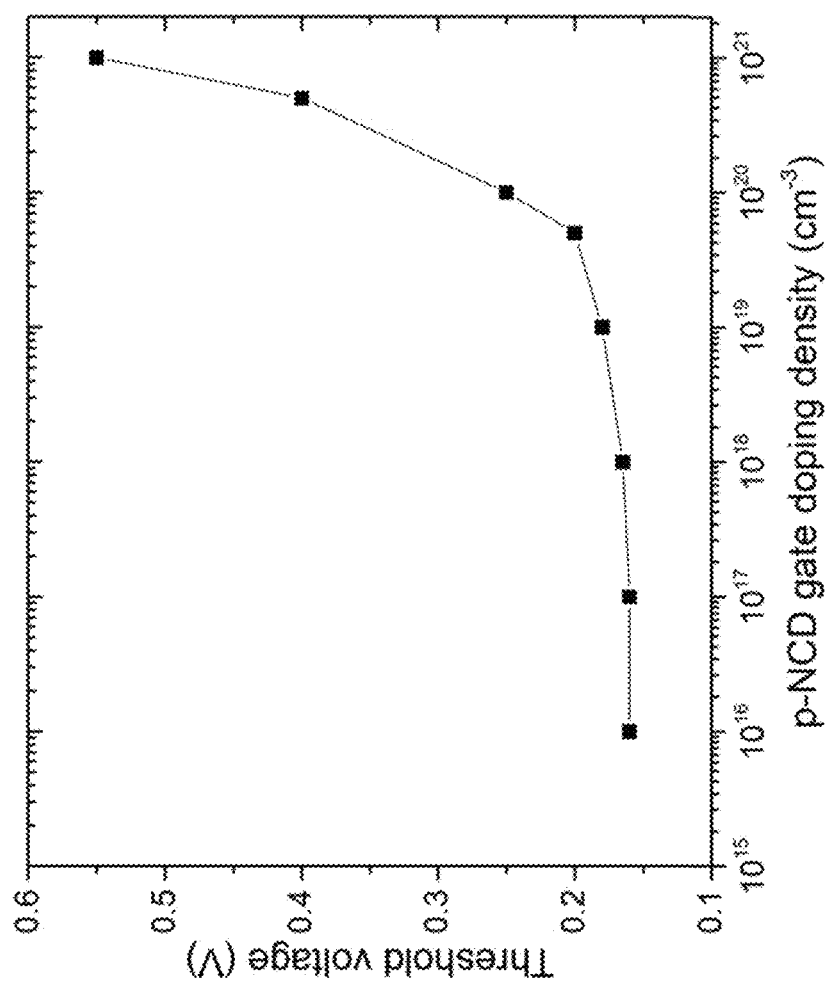
FIG. 5 shows a threshold voltage variation as a function of p-type doping densities of a p-NCD layer.

FIG. 5 shows the threshold voltages ($V_{th}$) as a function of doping density in p-NCD layer 18. Boron doping (p-doping) in single-crystal, polycrystalline, and nanocrystalline diamond (NCD) can reach a concentration as high as $10^{18}$-$10^{21}$ cm$^{-3}$. In contrast, the p-doping in GaN only has a maximum p-doping concentration of $10^{17}$-$10^{18}$ cm$^{-3}$. As shown, when the doping density of p-NCD layer increases from $1 \times 10^{16}$ cm$^{-3}$ to $1 \times 10^{21}$ cm$^{-3}$, threshold voltages of InAlN/AlN/GaN HEMTs increase from 0.16V to 0.55V. The increase of $V_{th}$ is due to the higher conduction band pulling up by p-NCD layer as doping density increases. An even higher $V_{th}$ can be achieved by further etching InAlN barrier under the gate.

Figure 6A:
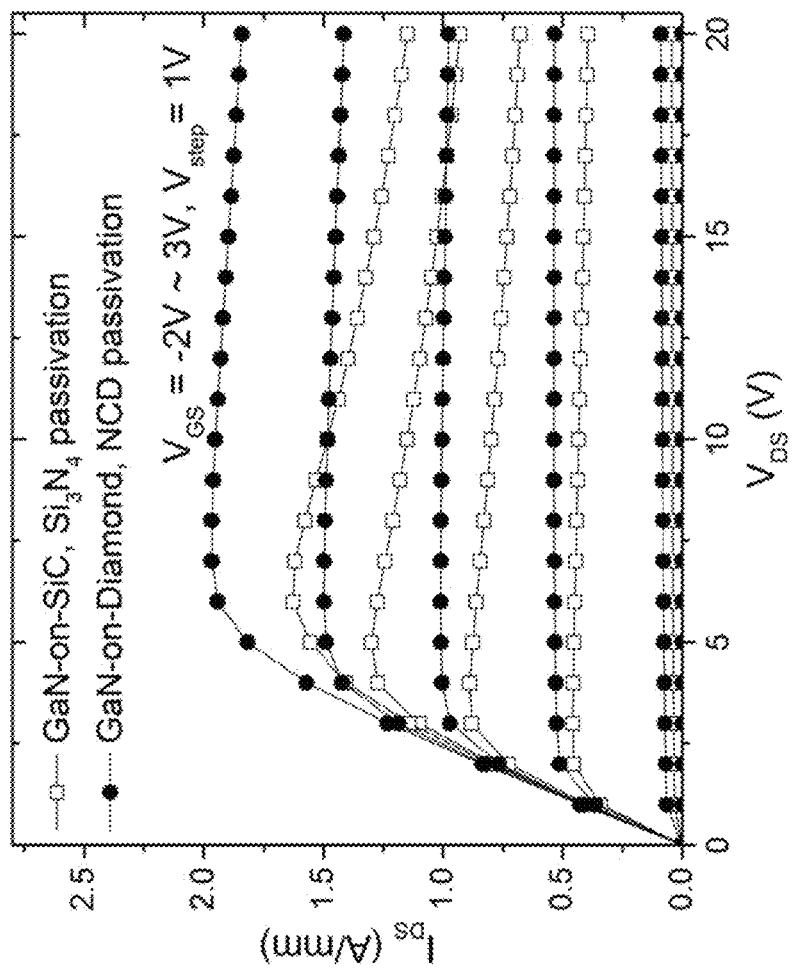
FIG. 6A shows $I_{ds}$-$V_{ds}$ characteristics of transistors having a SiC substrate and a diamond substrate.

FIG. 6A shows the $I_{ds}$-$V_{ds}$ curve of InAlN/AlN/GaN HEMTs with SiC substrate and Si$_3$N$_4$ passivation, and with diamond substrate and NCD passivation. The substrate thickness and passivation thickness are 100 µm and 1 µm, respectively. For the GaN-on-SiC structure, the back-barrier layer 11 and the passivation layer 17 are a p-GaN layer and a Si$_3$N$_4$ layer, respectively. And for GaN-on-Diamond structure, the back-barrier layer 11 and the passivation layer 17 are a p-diamond layer and an NCD layer, respectively.

As shown, the self-heating effect results in a dramatically decrease of output current $I_{ds}$ in the HEMT structure with a SiC substrate and Si$_3$N$_4$ passivation, which is caused by the relatively low thermal conductivity of substrate and passivation materials. At gate bias of 3V and drain bias of 20V, the $I_{ds}$ of the HEMT structure with SiC substrate and Si$_3$N$_4$ passivation is 1.15 A/mm. At the same bias condition, the HEMT structure with a diamond substrate and NCD passivation shows much higher output current $I_{ds}$ of 1.84 A/mm. It can be seen that an improvement of 61% in output drain current is achieved.

Figure 6B:
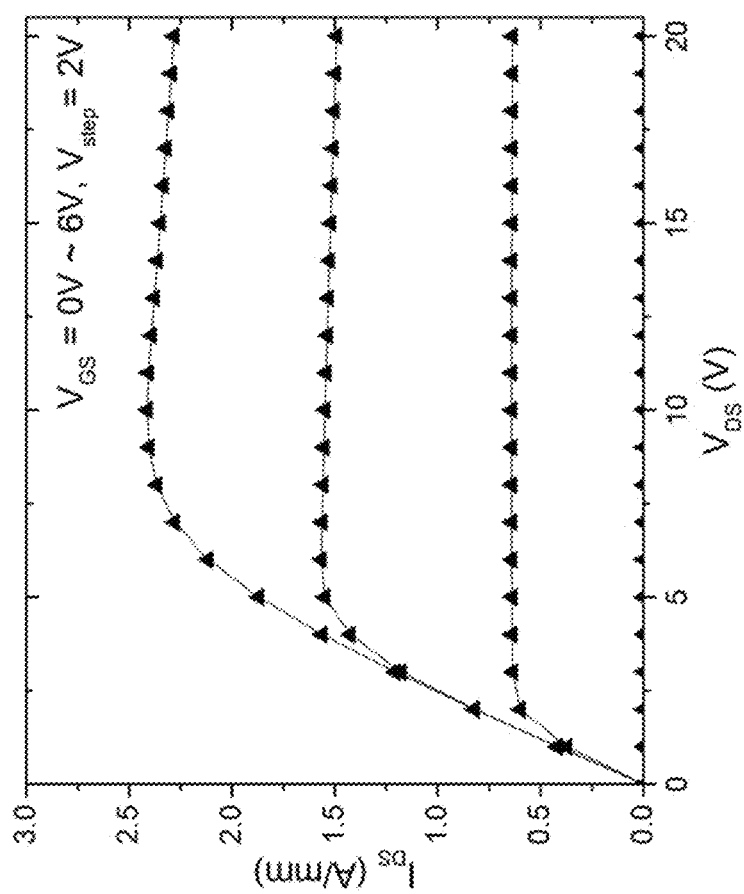
FIG. 6B shows $I_{ds}$-$V_{ds}$ characteristics of a transistor having a p-NCD gate.

FIG. 6B shows the $I_{ds}$-$V_{ds}$ curve of the InAiN/AlN/GaN HEMT with a p-NCD gate layer indicated in FIG. 2B. The device is with a 100 µm diamond substrate and a 1 µm thick NCD passivation layer. The exemplary doping density and thickness of the p-NCD gate layer is $1 \times 10^{20}$ cm$^{-3}$ and 100 nm, respectively. As shown, a higher output drain current $I_{ds}$ of 2.28 A/mm is presented at $V_{gs}$=6V, which exhibits a nearly 24% and 98% increase of $I_{ds}$ over the HEMT structures with diamond substrate/NCD passivation and with SiC substrate/Si$_3$N$_4$ passivation, respectively. It is noteworthy to mention that the gate leakage current in the NCD-gate HEMT structure is much less than a reference device due to the fact that the gate leakage is governed by the p-NCD/

InAlN heterojunction. Experiment results show that the device with the p-NCD-gate layer can achieve low leakage current up to $V_{gs}$=10V, while the gate bias only goes up to 2V or 3V to maintain low leakage current in the reference device. In the simulation, p-NCD gate HEMT shows over 10 orders of magnitude reduction in leakage current than the reference device. In the simulations, trapping effects have not been considered in the transfer characteristics.

Figure 7:
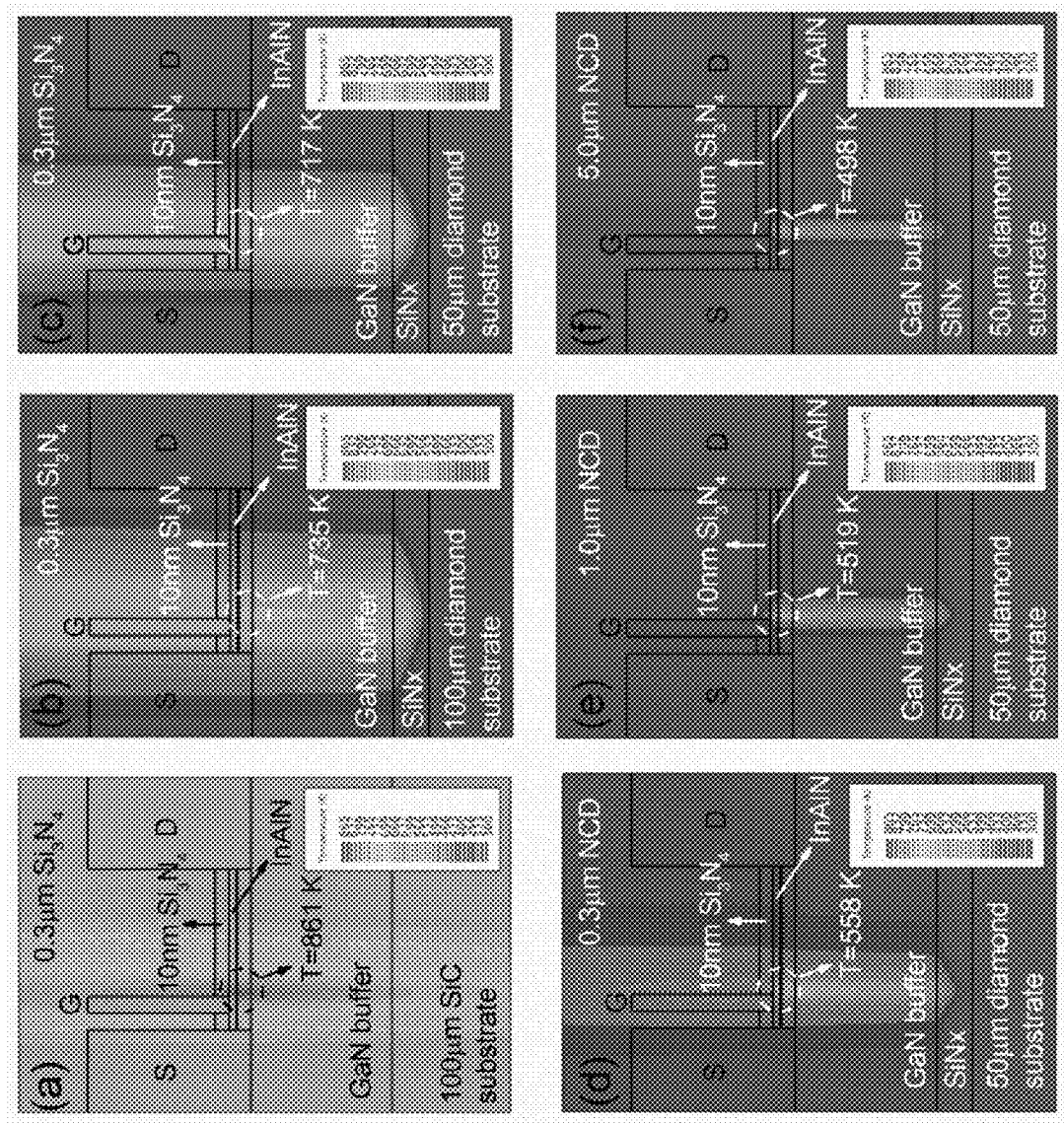
FIG. 7 shows simulation results (a)-(f) of temperature distributions of different device structures.

FIG. 7 shows simulation results of temperature distributions of different device structures (a)-(f). The structure (a) includes a 100 μm thick SiC substrate and a 0.3 μm thick $Si_3N_4$ passivation layer, the structure (b) includes a 100 μm thick diamond substrate and a 0.3 μm thick $Si_3N_4$ passivation layer, the structure (c) includes a 50 μm thick diamond substrate and a 0.3 μm thick $Si_3N_4$ passivation layer, the structure (d) includes a 50 μm thick diamond substrate and a 0.3 μm thick NCD passivation layer, the structure (e) includes a 50 μm thick diamond substrate and a 1.0 μm thick NCD passivation layer, and the structure (f) includes a 50 μm thick diamond substrate and a 5.0 μm thick NCD passivation layer.

FIG. 7 shows the simulation results of the peak temperature distributions of HEMTs regarding the structures (a)-(f). The bias condition for all the six structures are the same at $V_{gs}$=3V, $V_{ds}$ 20V. For the structure (a) with the SiC substrate and the $Si_3N_4$ passivation layer, the peak temperature (hot spot) is seen at the drain side gate edge with a value of 861 K. While the peak temperature reduced to 735 K in the case of the structure (b) with the diamond substrate. Further temperature reduction can be achieved by etching the diamond substrate down to 50 μm as indicated in the structure (c), which makes the backside heating sink get closer to the hot spot. In addition, it can be seen in the structures (c) (e) that the topside passivation thickness and material are even more effective to reduce the peak temperature than the backside substrate etching case.

Comparing with the HEMT structure with a 0.3 μm thick $Si_3N_4$ passivation layer, the peak temperature in the HEMT with a 0.3 μm thick NCD layer shows a dramatically reduction from 717 K to 558 K. This temperature reduction is due to the fact that topside heat spreading layer is much closer to the heat sink. Moreover, it shows that the thicker NCD passivation, the better thermal performance can be achieved. As the NCD passivation thickness increases from 0.3 μm to 5 μm, the peak temperature reduces from 558K to 498K. This indicates that a too thick NCD passivation layer would not improve the thermal performance, but would increase the difficulty in fabrication. Therefore, a preferred NCD thickness is between 1 μm and 5 μm.

Figures 8A, 8B:
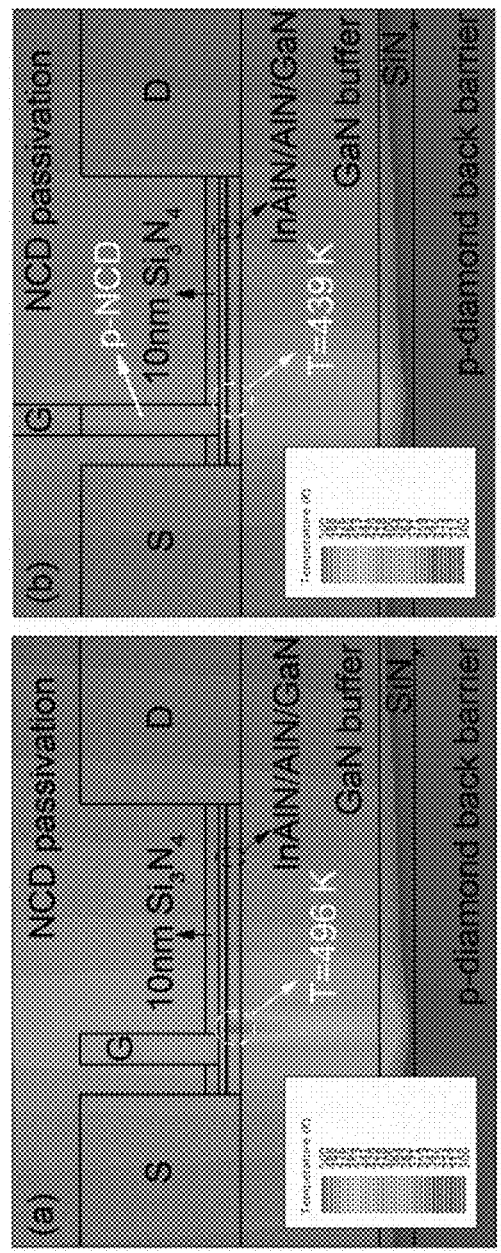
FIG. 8A and FIG. 8B show simulation results of temperature distributions of transistors having different gate structures.

FIG. 8A and FIG. 8B show simulation results of temperature distributions of HEMTs (a) and (b) corresponding to the structures shown in FIG. 2A and FIG. 2B, respectively. In this case, the structure of FIG. 2A does not include a p-NCD gate layer, whereas the structure of FIG. 2B includes a p-NCD gate layer. Since the two HEMTs have different threshold voltages, the gate biases applied to the HEMT structures (a) and (b) are 3V and 6V, respectively, and the drain biases are selected to achieve the same output power density of 35 W/mm.

It is seen that the p-NCD-gate HEMT exhibits a nearly 12% reduction in the peak temperature since the NCD gate film is in direct contact with the hot spot in the device, which enhances the heat spreading effect. In practical applications, the device peak temperature $T_{peak}$ is limited to, for example, 600 K, to ensure long term reliable operation. This peak temperature limit determines the device maximum allowable power dissipation.

Figure 9:
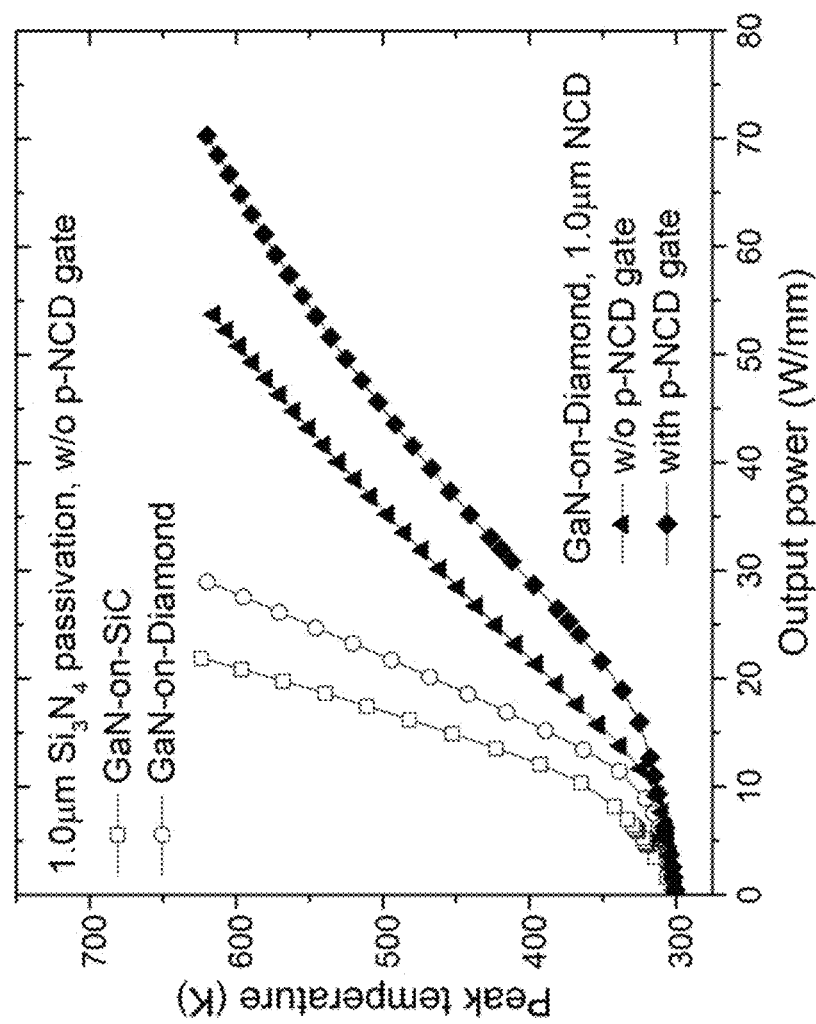
FIG. 9 shows power-temperature $T_{peak}$ dependences for a SiC substrate transistor and diamond substrate transistors.

FIG. 9 shows power-temperature $T_{peak}$ dependences for a SiC substrate transistor and diamond substrate transistors.

The structure of the SiC substrate transistor is a GaN-on-SiC HEMTs with a $Si_3N_4$ passivation layer, and the structures of the diamond substrate transistors are, respectively, a GaN-on-diamond HEMT with a $Si_3N_4$ passivation layer, a GaN-on-diamond HEMT with a NCD passivation layer and a GaN-on-diamond HEMT with a NCD passivation layer and a p-NCD gate film. The thicknesses of the substrate 10 and the passivation layer 17 are fixed at 100 μm and 1 μm for all cases.

As shown in the figure, for $T_{peak}$=600K, ~32% higher power density can be achieved by replacing the SiC substrate and a p-GaN back-barrier layer with the diamond substrate and a p-diamond back-barrier layer.

Comparing with the devices with the same diamond substrate and the p-diamond back-barrier layer but having different passivation layers, the device with a NCD passivation layer shows ~84% improvement in the power density than other device with $Si_3N_4$ passivation layers for $T_{peak}$=600K.

In addition, another ~28% power density improvement over the device with the diamond substrate and the NCD passivation layer can be achieved by using the NCD-gate film structure, which directly contacting with the heat spreading layer to the hottest spot in the device. The NCD-gate InAlN/AlN/GaN HEMT with the diamond substrate and the NCD passivation layer shows a power density of 65 W/mm for $T_{peak}$=600K, which is more than three times than that of normal gate InAlN/AlN/GaN HEMT with the SiC substrate and the $Si_3N_4$ passivation layer (21 W/mm). These results indicate that topside heat spreading technology, such as a NCD gate film and a NCD passivation layer have a great potential in the thermal management of GaN power devices.

In high frequency applications, the GaN high electron mobility transistors (HEMTs) are vulnerable to short-channel effects like all FETs when the gate length scales below 0.2 μm. The short gate length causes the short-channel effects such as threshold-voltage ($V_{th}$) shift, soft pinchoff, and high subthreshold current.

Figure 10:
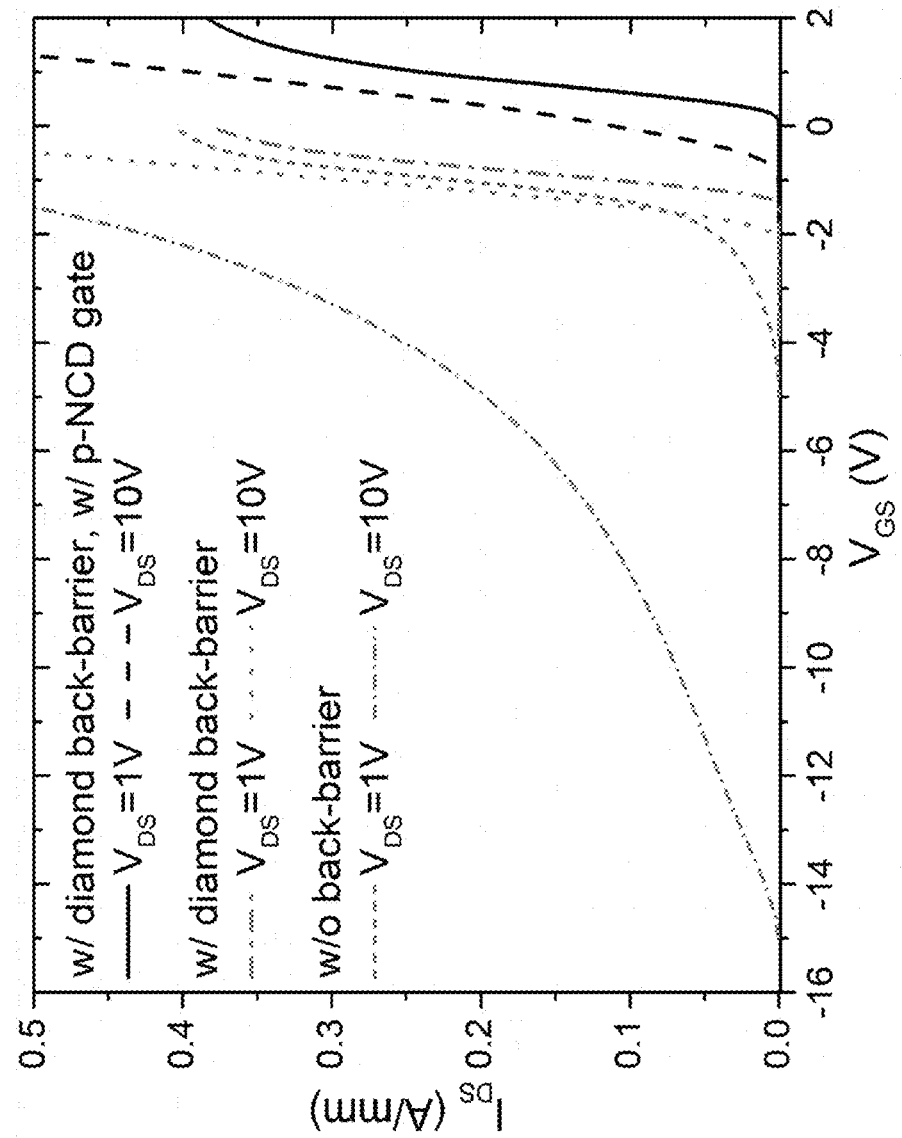
FIG. 10 shows simulation results of transfer characteristics of transistors having different structures.

FIG. 10 shows a simulation result of transfer characteristics of transistors having different structures. In this case, the simulated structures are GaN HEMTs without back-barrier layer, with a p-diamond back-barrier layer, and with p-diamond back-barrier layer and a p-NCD gate layer.

It is seen that the transfer curve at $V_{ds}$ of 1 V and 10V in the device with a 50 nm gate length. Thanks to the larger energy barrier formed by p-diamond compared with device without a back-barrier layer, short-gate HEMTs with p-diamond back-barrier layers show not only a much smaller $V_{th}$ shift but also a significant improvement in the subthreshold slope.

Figure 11:
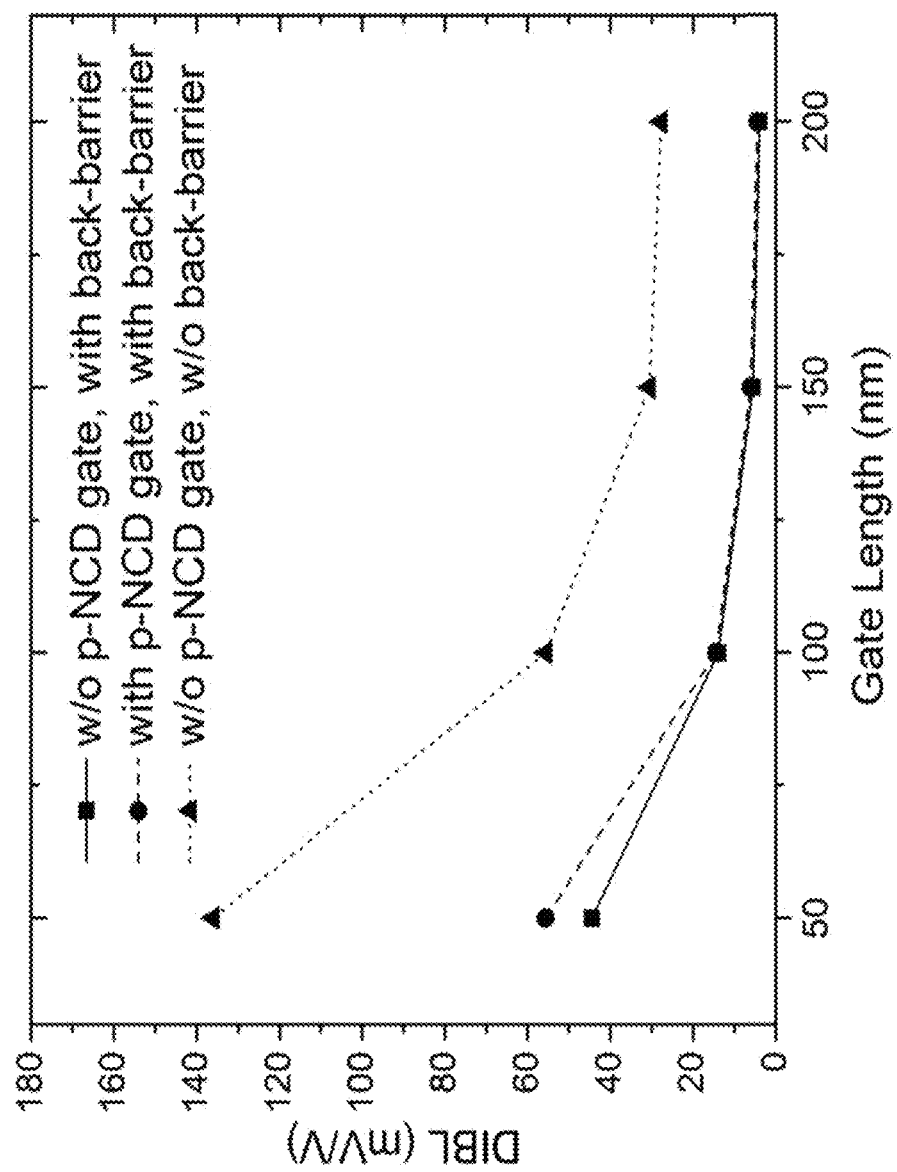
FIG. 11 shows simulation results of drain-induced barrier lowering (DIBL) as a function of gate lengths of transistors.

FIG. 11 shows simulation results of drain-induced barrier lowering (DIBL) (defined as $V_{th}/V_{ds}$ and $V_{ds}$ of 1 and 10 V used in the simulation) as a function of gate length $L_g$ in a normal gate HEMT with and without diamond back barrier, and a p-NCD gate HEMT with a diamond back-barrier layer. The drain-induced barrier lowering (DIBL) is a short-channel effect in FETs referring originally to a reduction of threshold voltage of the transistor at higher drain voltages, which needs to keep as low as possible for device operation. For a 50 nm short-gate device, the DIBL value is as low as 45 mV/V in the device with a back-barrier layer, which shows ~70% reduction than it in the device without a back-barrier layer (138 mV/V). The DIBL value in the NCD-gate device is 55 mV/V, which shows ~18% increase than the normal gate device. Further improvements to suppress DIBL in the NCD gate device include increasing doping density in the p-diamond back barrier layer 11 and optimizing the thickness of the channel layer 13.

Figure 12:
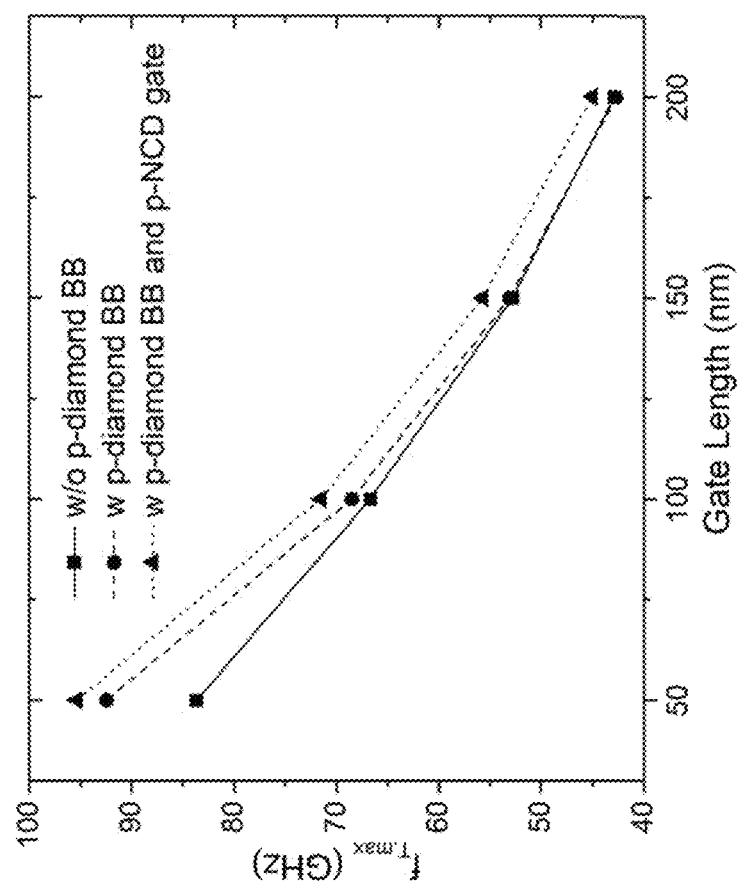
FIG. 12 shows simulation results of peak $f_{T.max}$ as a function of gate lengths for three different transistors.

FIG. 12 shows simulation results of peak cutoff frequency $f_{T,max}$ as a function of gate lengths for three different transistors. Three transistors correspond to a HEMT structure including a p-type diamond barrier layer (solid circle), a p-gate HEMT structure including a p-type diamond barrier layer and p-type NCD gate layer (solid triangle) and a reference HEMT structure without a p-type diamond layer (solid square).

In FIG. 12, current gain cutoff frequencies are indicated as a function of $V_{gs}$ in these three devices. The device transfer characteristics were simulated in ac mode at $V_{ds}=1V$, and transconductance $g_m$ and gate capacitances $C_{gd}$ and $C_{gs}$ were extracted as a function of $V_{gs}$. The intrinsic cutoff frequency $f_T$ was calculated for each $V_{gs}$ by the following formula and the peak $f_T$ was extracted:

$$f_T = \frac{g_m}{2\pi C_{gs} \sqrt{1 + 2(C_{gd}/C_{gs})}}$$

As shown in the figure, due to the smaller gate capacitance in shorter gate devices, an almost two times increase in $f_{T,max}$ can be achieved as gate length decreases from 200 nm to 50 nm. In addition, a slightly higher $f_{T,max}$ is observed in HEMTs with p-diamond BBs than HEMTs without BBs, which is due to the slight larger transconductance $g_m$ achieved by better carrier confinement. Moreover, the NCD-gate HEMTs show a slight increase in $f_{T,max}$ than the normal gate HEMT, indicating that the incorporation of the p-NCD gate does not diminish the frequency performances of devices. NCD-gate InAlN/AlN/GaN HEMTs show a $f_{T,max}$ of ~96 GHz with 50 nm gate length.

The above-described embodiments of the present invention can be implemented in any of numerous ways. For example, the embodiments may be implemented using hardware, software or a combination thereof. When implemented in software, the software code can be executed on any suitable processor with a memory or collection of processors with memories, whether provided in a single computer or distributed among multiple computers. Such processors may be implemented as integrated circuits, with one or more processors in an integrated circuit component. Though, a processor may be implemented using circuitry in any suitable format.

Also, the embodiments of the invention may be embodied as a method, of which an example has been provided. The acts performed as part of the method may be ordered in any suitable way. Accordingly, embodiments may be constructed in which acts are performed in an order different than illustrated, which may include performing some acts simultaneously, even though shown as sequential acts in illustrative embodiments.

Use of ordinal terms such as "first," "second," in the claims to modify a claim element does not by itself connote any priority, precedence, or order of one claim element over another or the temporal order in which acts of a method are performed, but are used merely as labels to distinguish one claim element having a certain name from another element having a same name (but for use of the ordinal term) to distinguish the claim elements.

Although the invention has been described by way of examples of preferred embodiments, it is to be understood that various other adaptations and modifications can be made within the spirit and scope of the invention.

Therefore, it is the object of the appended claims to cover all such variations and modifications as come within the true spirit and scope of the invention.

We claim:

1. A semiconductor device, comprising:
    a substrate;
    a back-barrier layer arranged on the substrate, the back-barrier layer including first p-type dopant atoms;
    an intermediate or nucleation layer having a lattice constant different from a lattice constant of the back-barrier layer;
    a semiconductor heterostructure having a channel layer, a spacer layer on the channel layer and a barrier layer on the spacer layer, wherein a combination of materials of the barrier layer, the spacer layer and the channel layer is selected such that a carrier charge is provided to the channel layer;
    a gate layer arranged to partially cover a top of the barrier layer, wherein the gate layer includes second p-type dopant atoms; and
    a set of electrodes for providing and controlling the carrier charge in the carrier channel.

2. The semiconductor device of claim 1, wherein the back-barrier layer has a first doping density of the first p-type dopant atoms in a range from $1 \times 10^{16}$ cm$^{-3}$ to $1 \times 10^{21}$ cm$^{-3}$.

3. The semiconductor device of claim 1, wherein the back-barrier layer has a thickness in a range from 100 nm to 1000 nm.

4. The semiconductor device of claim 1, wherein the intermediate layer has a thickness in a range from 25 nm to 100 nm.

5. The semiconductor device of claim 1, wherein a material of the intermediate layer is silicon nitride (SiN$_x$) or silicon dioxide (SiO$_2$).

6. The semiconductor device of claim 1, wherein the nucleation layer is formed from III-V compound materials.

7. The semiconductor device of claim 6, wherein a material of the nucleation layer is aluminum nitride (AlN).

8. The semiconductor device of claim 1, wherein the channel layer has a thickness in a range from 50 nm to 200 nm.

9. The semiconductor device of claim 1, wherein the spacer layer has a lattice constant different from a lattice constant of the channel layer, and a bandgap energy of the spacer layer is greater than a bandgap of the channel layer.

10. The semiconductor device of claim 1, wherein the combination of the materials of the barrier layer and the channel layer is a pair of indium aluminum nitride (InAlN) and gallium nitride (GaN), aluminum gallium nitride (AlGaN) and GaN, aluminum nitride (AlN) and GaN, or indium aluminum gallium nitride (InAlGaN) and GaN.

11. The semiconductor device of claim 1, wherein the gate layer is formed from nanocrystalline diamond (NCD).

12. The semiconductor device of claim 1, wherein the gate layer has a second dopant density of the second p-type dopant atoms in a range from $1 \times 10^{18}$ cm$^{-3}$ to $1 \times 10^{21}$ cm$^{-3}$.

13. The semiconductor device of claim 1, wherein the gate layer has a thickness in a range from 50 nm to 100 nm.

14. The semiconductor device of claim 1, wherein the gate layer is covered by a gate electrode formed from a platinum (Pt) layer, a palladium (Pd) layer, or nickel-gold (Ni/Au) stacked layers.

15. The semiconductor device of claim 1, wherein the barrier layer is an unintentionally doped In$_{0.17}$Al$_{0.83}$N layer.

16. The semiconductor device of claim 1, further comprising:
a dielectric layer disposed on open areas of a top of the barrier layer, wherein the open areas are defined by the set of the electrodes.

17. The semiconductor device of claim 16, wherein the dielectric layer is a NCD layer.

18. The semiconductor device of claim 16, further comprising:
a passivation layer disposed to cover the set of electrodes and the dielectric layer.

19. The semiconductor device of claim 18, wherein the substrate is a diamond substrate.

20. A method for designing a semiconductor device comprising:
selecting a substrate;
arranging a back-barrier layer on the substrate, wherein the back-barrier layer includes p-type dopant atoms;
arranging an intermediate or nucleation layer on the back-barrier layer, wherein the intermediate or nucleation layer has a lattice constant different from a lattice constant of the back-barrier layer;
selecting a semiconductor heterostructure having a channel layer, a spacer layer on the channel layer and a barrier layer on the spacer layer, wherein a combination of materials of the barrier layer, the spacer layer and the channel layer is selected such that a carrier charge is provided to the channel layer;
arranging a gate layer to partially cover a top of the barrier layer, wherein the gate layer includes p-type dopant atoms; and
arranging a set of electrodes for providing and controlling the carrier charge in the carrier channel.

* * * * *